(12) United States Patent
Piquette et al.

(10) Patent No.: US 10,570,333 B2
(45) Date of Patent: Feb. 25, 2020

(54) WAVELENGTH CONVERSION ELEMENT, LIGHT EMITTING DEVICE AND METHOD FOR PRODUCING A WAVELENGTH CONVERSION ELEMENT

(71) Applicant: OSRAM OPTO Semiconductors GmbH, Regensburg (DE)

(72) Inventors: Alan Piquette, Peabody, MA (US); Adam Scotch, Amesbury, MA (US); Gertrud Kraeuter, Regensburg (DE); Matthias Loster, Regensburg (DE)

(73) Assignee: OSRAM OPTO Semiconductors GmbH, Regensburg (DE)

( * ) Notice: Subject to any disclaimer, the term of this patent is extended or adjusted under 35 U.S.C. 154(b) by 226 days.

(21) Appl. No.: 15/602,175

(22) Filed: May 23, 2017

(65) Prior Publication Data
US 2018/0340119 A1 Nov. 29, 2018

(51) Int. Cl.
*C09K 11/77* (2006.01)
*C09K 11/02* (2006.01)
(Continued)

(52) U.S. Cl.
CPC ............ *C09K 11/7774* (2013.01); *C08K 3/22* (2013.01); *C08K 3/36* (2013.01); *C09K 11/02* (2013.01);
(Continued)

(58) Field of Classification Search
CPC .................................................. H01L 33/501
See application file for complete search history.

(56) References Cited

U.S. PATENT DOCUMENTS

| | | | |
|---|---|---|---|
| 8,242,684 B2 * | 8/2012 | Piquette .................. | H01L 33/44 313/483 |
| 8,334,646 B2 * | 12/2012 | Piquette .................. | H01L 33/44 313/483 |

(Continued)

FOREIGN PATENT DOCUMENTS

| | | | | |
|---|---|---|---|---|
| WO | 2014064555 A1 | 5/2014 | | |
| WO | WO-2015033824 A1 * | 3/2015 | ......... | C09K 11/7734 |
| WO | 2015153415 A1 | 10/2015 | | |
| WO | 2017182390 A1 | 10/2017 | | |
| WO | 2018002334 A1 | 1/2018 | | |

OTHER PUBLICATIONS

International Search Report based on application No. PCT/EP2018/061920 (13 pages) dated Jul. 27, 2018 (for reference purpose only).

*Primary Examiner* — Michael M Dollinger
(74) *Attorney, Agent, or Firm* — Viering Jentschura & Partner MBB

(57) ABSTRACT

A wavelength conversion element comprising a crosslinked matrix and at least one phosphor dispersed in said matrix, wherein said matrix is made from a precursor material comprising a precursor having a structure chosen from one of the generic formulae

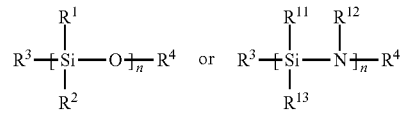

is provided. Further, a light emitting device comprising a wavelength conversion element and a method for producing a wavelength conversion element are provided.

21 Claims, 6 Drawing Sheets

(51) Int. Cl.
  *H01L 33/50*   (2010.01)
  *F21K 9/64*    (2016.01)
  *C08K 3/22*    (2006.01)
  *C08K 3/36*    (2006.01)
  *F21V 7/22*    (2018.01)
  *F21Y 115/30*  (2016.01)
  *F21Y 115/10*  (2016.01)

(52) U.S. Cl.
  CPC .............. *C09K 11/025* (2013.01); *F21K 9/64* (2016.08); *F21V 7/22* (2013.01); *H01L 33/501* (2013.01); *H01L 33/502* (2013.01); *C08K 2003/2227* (2013.01); *F21Y 2115/10* (2016.08); *F21Y 2115/30* (2016.08)

(56) References Cited

U.S. PATENT DOCUMENTS

| | | | |
|---|---|---|---|
| 2013/0221400 A1* | 8/2013 | Tanikawa | H01L 23/296 257/99 |
| 2015/0136306 A1* | 5/2015 | Wakamatsu | G02B 5/00 156/67 |
| 2015/0188006 A1* | 7/2015 | Williams | H01L 33/56 257/98 |
| 2015/0284627 A1* | 10/2015 | Bohmer | C09K 11/87 362/84 |
| 2017/0139113 A1* | 5/2017 | Peeters | F21S 41/24 |
| 2019/0123248 A1* | 4/2019 | Krauter | H01L 33/56 |

* cited by examiner

WAVELENGTH CONVERSION ELEMENT, LIGHT EMITTING DEVICE AND METHOD FOR PRODUCING A WAVELENGTH CONVERSION ELEMENT

TECHNICAL FIELD

The present disclosure relates to a wavelength conversion element, a light emitting device and a method for producing a wavelength conversion element.

BACKGROUND

Common wavelength converting elements are not stable at temperatures above 200° C. Other widely used common conversion layers are relatively expensive and it is not easy to combine two or more wavelength converting materials into one conversion layer.

There is a need for a wavelength conversion element that is thermally stable, that is inexpensive to produce and that accommodates multiple phosphors into one conversion element.

SUMMARY

To overcome the above-mentioned problems, a wavelength conversion element with improved properties, a light emitting device and a method for producing a wavelength conversion element according to the independent claims are provided. Embodiments of the wavelength conversion element, the light emitting device and the method are subject of the description and the dependent claims.

According to one aspect a wavelength conversion element comprising a crosslinked matrix and at least one phosphor dispersed in said matrix is provided. Said matrix is made from a precursor material comprising a precursor having a structure chosen from one of the generic formulae wherein $R^1$ and $R^2$ are—independently from each other—chosen from a group consisting of alkyl, alkoxy, aryl, aryloxy, alkenyl, substituted alkyl, substituted alkoxy, substituted aryl, substituted aryloxy, substituted alkenyl, and combinations thereof, $R^{11}$, $R^{12}$ and $R^{13}$ are—independently from each other—chosen form a group consisting of H, alkyl, alkoxy, aryl, aryloxy, alkenyl, substituted alkyl, substituted alkoxy, substituted aryl, substituted aryloxy, substituted alkenyl, and combinations thereof, and $R^3$ and $R^4$ are—independently from each other—chosen from a group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof.

In other words, the precursor material for the crosslinked matrix comprises a substituted polysiloxane precursor or a substituted polysilazane precursor. The backbone of the polysiloxane precursor comprises alternating silicon and oxygen atoms, the backbone of the polysilazane precursor comprises alternating silicon and nitrogen atoms. Typically, the precursor is a liquid at room temperature.

A wavelength conversion element is to be understood as an element that absorbs electromagnetic radiation within a certain first range of wavelengths and then emits radiation having a second range of wavelengths. These wavelength ranges can be distinct from each other or there could be a significant overlap between the absorbed and the emitted wavelengths. The absorption and the emission of wavelengths is performed by the phosphor incorporated in the wavelength conversion element.

Wavelength conversion elements are generally made separately as a stand-alone piece, and then incorporated into a desired product or device in a subsequent step. Nevertheless, they can also be produced in situ in the desired product or device.

$R^1$ and $R^2$ and, respectively, $R^{11}$, $R^{12}$ and $R^{13}$ are according to one embodiment chosen from a group consisting of methyl, methoxy, ethyl, ethoxy, phenyl, phenoxy, vinyl, and trifluoropropyl. In a further embodiment, $R^1$ and $R^2$ and, respectively, $R^{11}$, $R^{12}$ and $R^{13}$ are independently from each other methyl and methoxy.

According to another embodiment, $R^1$ and $R^2$ and, respectively, $R^{11}$, $R^{12}$ and $R^{13}$ comprise an alkoxy content, for example a methoxy content, in the range of from 10 wt % to 50 wt %, advantageously in the range of 15 wt % to 45 wt %, even more advantageously in the range of 30 wt % to 40 wt %. For example, a repeating unit of a precursor may comprise the generic formula:

Any other combination of a polysiloxane backbone or a polysilazane backbone with alkyl, for example methyl, and alkoxy, for example methoxy, side groups is possible as well. For example, there could be a silicon atom being substituted with two methyl groups or two methoxy groups as long as the total alkoxy content of all precursor compounds in the precursor material falls within the above-mentioned ranges to have enough reactive groups for building the cross-linked matrix.

The terminal groups of the polysiloxane precursor and the polysilazane precursor, i.e. $R^3$ and $R^4$, comprise according to an embodiment independently from each other chemically reactive groups such as for example alkoxy, vinyl, hydroxyl, carboxylic acid, or ester. In other embodiments, the terminal groups could be less reactive, such as hydrogen, methyl, ethyl or any other alkyl or aryl groups.

According to one embodiment, the crosslinked matrix comprises an organic content of less than 40 wt %. In a preferred embodiment, the organic content is less than or equal to 25 wt %. This is a greatly reduced organic content in contrast to that being found in a typical methyl silicone. The reduced organic content can be obtained by an increased number of crosslinks in the matrix and a reduced number of side chains.

According to one embodiment, a wavelength conversion element is provided comprising a crosslinked matrix and at least one phosphor dispersed in that matrix, wherein said matrix is made from a precursor material comprising a precursor having a structure chosen from one of the generic formulae wherein $R^1$ and $R^2$ are—independently from each other—chosen from a group consisting of alkyl, alkoxy, aryl, aryloxy, alkenyl, substituted alkyl, substituted alkoxy, substituted aryl, substituted aryloxy, substituted alkenyl, and combinations thereof, $R^{11}$, $R^{12}$ and $R^{13}$ are—independently from each other—chosen form a group consisting of H, alkyl, alkoxy, aryl, aryloxy, alkenyl, substituted alkyl, substituted alkoxy, substituted aryl, substituted aryloxy, substituted alkenyl, and combinations thereof, and $R^3$ and $R^4$ are—independently from each other—chosen from a group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof, $R^1$ and $R^2$ and $R^{11}$, $R^{22}$ and $R^{13}$ comprise an alkoxy content being in the range from 10 wt % to 50 wt %, and wherein the crosslinked matrix comprises an organic content of less than 40 wt %.

Thus, a wavelength conversion element is provided comprising one or more phosphor materials dispersed in a highly crosslinked matrix based on a polysiloxane or a polysilazane precursor. Such a wavelength conversion element is more thermally stable than a material based on a standard optical silicone matrix. The wavelength conversion element can be made with cleaner and sharper edges than, for example, a standard screen-printed silicone-based converter.

Furthermore, the wavelength conversion element can be made using an inexpensive process at room temperature or slightly elevated temperatures if it is desired to speed up the curing process of the precursor material. Because the fabrication process of the wavelength conversion element does not require high temperatures or solvents, nearly all phosphors and combinations of nearly all phosphors may be dispersed in the crosslinked matrix, so different colors from blue to red, including combinations, e.g. cool- and warm-white blends, are possible. Additionally, the wavelength conversion element is more uniform in terms of brightness and color point because its thickness and surface roughness can be better controlled due to the material of the crosslinked matrix.

The properties of the matrix and, thus, of the wavelength conversion element, can be tuned by modifying the precursor material. In the above shown precursor units, the reactive group is an alkoxy group which can be equally represented by $R^1$, $R^2$, $R^{11}$, $R^{12}$, and/or $R^{13}$. Apart from the groups $R^1$, $R^2$, $R^{11}$, $R^{12}$, and $R^{13}$, the terminal groups $R^3$ and $R^4$ can be varied as well as the number of repeating units n. Even with this number n, the properties of the matrix material can be changed. For example, a lower n will generally lead to a lower viscosity and a higher n will lead to a higher viscosity of the precursor.

The repeating number n is according to one embodiment chosen such that the viscosity of the precursor is in the range of 1 to 150 mPas, advantageously in the range of 1 to 60 mPas, and even more advantageously in the range of 2 to 20 mPas. Thus, low molecular weight precursors are provided. For example, n might be chosen to be <10.

According to one embodiment, the above-mentioned precursors may form a crosslinked matrix when exposed to water or humidity by undergoing hydrolysis and condensation reactions. By this, the low molecular weight precursors are crosslinked to a dense, three-dimensional network.

According to one embodiment, the crosslinked matrix comprises a three-dimensional siloxane-based network having the generic formula wherein each R is—independently from each other—chosen from a group consisting of a group listed for $R^1$, $R^2$, $R^3$, $R^4$, $R^{11}$, $R^{12}$, $R^{13}$, or any combination thereof, and the dangling bonds are—independently from each other—representative of a continuation of the network and one of the groups listed for $R^1$, $R^2$, $R^3$, $R^4$, $R^{11}$, $R^{12}$, $R^{13}$. Such a crosslinked matrix material may result independently if a polysiloxane precursor or a polysilazane precursor is used to form the matrix material.

A possible siloxane-based network based on a methyl methoxy polysiloxane precursor that could result if all the methoxy groups participate in crosslinking is shown in the following generic formula:

It is to be noted that the structures shown above are stylized examples that are easy to visualize, but it is not meant to be technically accurate. Thus, not necessarily all of the methoxy groups would result in crosslinking, for example. Some of them might remain intact and some of them might be replaced by silanol groups.

According to one embodiment, the precursor material additionally comprises at least one additive that is chosen from a group consisting of catalysts, inorganic microparticles, inorganic nanoparticles, metal-organic compounds, organic molecules, organically modified silicas, organically modified silicates, organically modified ceramics, organic polymers, inorganic polymers, and combinations thereof.

As the precursor material generally is a liquid, it is easily possible to incorporate the additives into the wavelength conversion element. The additives can serve different purposes, such as controlling the viscosity during the fabrication, providing crack resistance and enhanced mechanical strength, tuning the refractive index or increasing the thermal connectivity.

According to one embodiment the catalyst comprises a material class chosen from a group consisting of titanium alkoxides, zirconium alkoxides, tin-containing salts, organo-tin compounds, acids, bases, amine-containing compounds and combinations thereof.

According to one embodiment, the catalyst comprises a tetra-n-butyl titanate. This is a typical catalyst for the curing of a precursor to a crosslinked matrix additionally to water or humidity. The tetra-n-butyl titanate may not be strictly necessary since the presence of liquid water or gaseous humidity is generally sufficient for the curing step to get a crosslinked matrix. A typical amount of the catalyst being added to the precursor material may be from 1 wt % to 5 wt %.

Other additives can be added to the precursor material in order to influence the processability of the precursor and/or the final properties of the highly crosslinked matrix and, thus, of the wavelength conversion element.

According to one embodiment the inorganic microparticles are chosen from a group consisting of silicon dioxide ($SiO_2$), aluminium oxide ($Al_2O_3$), titanium dioxide ($TiO_2$), zirconium dioxide ($ZrO_2$), zinc oxide (ZnO), rare-earth garnets ($RE_3A_5O_{12}$, where RE is any combination of Y, Lu, Gd, Tb and A is any combination of Al, Ga, Sc) and combinations thereof.

According to one embodiment, the inorganic nanoparticles can be chosen from a group consisting of oxides, like silicon dioxide ($SiO_2$), zirconium dioxide ($ZrO_2$), titanium dioxide ($TiO_2$), aluminum oxide ($Al_2O_3$), or zinc oxide (ZnO), nitrides, like aluminum nitride (AlN), silicon nitride ($Si_3N_4$), or boron nitride (BN), carbon-based inorganic nanoparticles, like nano-diamond (C), carbon nanotubes, graphene or their derivatives, rare-earth garnets ($RE_3A_5O_{12}$, where RE is any combination of Y, Lu, Gd, Tb and A is any combination of Al, Ga, Sc), heteropoly acides like 12-tungstophosphoric acid ($H_3PW_{12}O_{40}$) and 12-tungstosilicic acid ($H_4SiW_{12}O_{40}$) and any combinations thereof. For example, fumed silica may be added as additive. Other compositions of inorganic nanoparticles are possible as well, and all the crystalline and non-crystalline phases of a given composition are also included. In some cases, to make them compatible, the surfaces of the inorganic nanoparticles are modified with capping agents to make them miscible with the precursor compound. The amount of inorganic nanoparticles in the precursor material may be in the range from 0 to 75 wt %.

According to one embodiment, the metal-organic compounds are chosen from a group consisting of titanium alkoxides, zirconium alkoxides, aluminum alkoxides, zinc alkoxides, halfnium alkoxides, organo-boron compounds and any combination thereof. The amount of metal-organic compounds may be in the range from 0 to 75 wt %.

According to one embodiment, the organic molecules are chosen from a group consisting of adhesion promotors, plasticizers, de-formers, thickeners, or thinners. The amount of organic molecules may be in the range from 0 to 10 wt %.

The organically modified silicas, the organically modified silicates, and the organically modified ceramics can be added as-is to the precursor or as un-reacted precursors of these materials. For example, ormosil or ormocer may be added.

According to another embodiment, the organic polymers and the inorganic polymers can be chosen from a group consisting of poly(dimethyl siloxane), poly(methylphenyl siloxane), poly(diphenyl siloxane), poly(silphenylene-siloxane), polyphosphazenes, polysilazane, perhydropolysilazane. The amount of organic and inorganic polymers may be in the range from 0 to 75 wt %.

According to another embodiment, the at least one phosphor is chosen from a group consisting of $(RE_{1-x}Ce_x)_3(Al_{1-y}A'_y)_5O_{12}$ with $0<x\leq0.1$ and $0\leq y\leq1$, $(RE_{1-x}Ce_x)_3(Al_{5-2y}Mg_ySi_y)O_{12}$ with $0<x\leq0.1$ and $0\leq y\leq2$, $(RE_{1-x}Ce_x)_3Al_{5-y}Si_yO_{12-y}N_y$ with $0<x\leq0.1$ and $0\leq y\leq0.5$, $(RE_{1-x}Ce_x)_2CaMg_2Si_3O_{12}:Ce^{3+}$ with $0<x\leq0.1$, $(AE_{1-x}Eu_x)_2Si_5N_8$ with $0<x\leq0.1$, $(AE_{1-x}Eu_x)AlSiN_3$ with $0<x\leq0.1$, $(AE_{1-x}Eu_x)_2Al_2Si_2N_6$ with $0<x\leq0.1$, $(Sr_{1-x}Eu_x)LiAl_3N_4$ with $0<x\leq0.1$, $(AE_{1-x}Eu_x)_3Ga_3N_5$ with $0<x\leq0.1$, $(AE_{1-x}Eu_x)Si_2O_2N_2$ with $0<x\leq0.1$, $(AE_xEu_y)Si_{12-2x-3y}Al_{2x+3y}O_yN_{16-y}$ with $0.2\leq x\leq2.2$ and $0<y\leq0.1$, $(AE_{1-x}Eu_x)_2SiO_4$ with $0<x\leq0.1$, $(AE_{1-x}Eu_x)_3Si_2O_5$ with $0<x\leq0.1$, $K_2(Si_{1-x-y}Ti_yMn_x)F_6$ with $0<x\leq0.2$ and $0<y\leq1-x$, $(AE_{1-x}Eu_x)_5(PO_4)_3Cl$ with $0<x\leq0.2$, $(AE_{1-x}Eu_x)Al_{10}O_{17}$ with $0<x\leq0.2$, $(Y_{1-x-y}Gd_xCe_y)_3Al_5O_{12}$ with $0\leq x\leq0.2$ and $0<y\leq0.05$, and combinations thereof, wherein RE is one or more of Y, Lu, Tb and Gd, AE is one ore more of Mg, Ca, Sr, Ba, A' is one or more of Sc and Ga, wherein the phosphors optionally include one ore more of halides.

The phosphor may be added to the precursor material in the form of a powder. The concentration of the phosphor or the phosphor blend may be equal to or smaller than 90 wt %, for example in the range of 15 wt % to 75 wt %, of the final phosphor-in-polysiloxane or phosphor-in-polysilazane converter material. For a given embodiment, the concentration of a given phosphor in the polysiloxane matrix or the polysilazane matrix depends on the activator (e.g. $Ce^{3+}$ or $Eu^{2+}$) concentration, the phosphor absorptance and quantum efficiency, the target color point, and if there are other scattering additives present in the matrix material.

According to one embodiment the wavelength conversion element comprises a thickness of between 10 μm and 500 μm, advantageously of between 25 μm and 200 μm.

According to another embodiment, the wavelength conversion element has a cuboid-like shape with top angles and bottom angles, said top angles and bottom angles being in the range of 80° to 100°, and with top edges and bottom edges, said top edges and bottom edges having a radius curvature of equal to or smaller than 20 μm, advantageously less than or equal to 15 μm, and even more advantageously less than or equal to 10 μm. Thus, a wavelength conversion element with sharp edges and smooth surfaces is provided.

The ideal shape of a wavelength conversion element is a rectangular cuboid. The cuboid may or may not have notches incorporated into itself to accommodate wire bonds or other packaging technology. With the exception of notched areas, if any notches are present, all of the angles should be close to 90°. Further, there should be a clear distinction between each surface of the cuboid, i.e. the top surface should be clearly distinguishable from the side surfaces and so on for all adjoining surfaces of the rectangular cuboid, and the edges should not be significantly rounded. The radius of curvature at the edges, i.e. the surface interfaces, is a good metric for this.

According to another embodiment, the element comprises a top surface, a bottom surface and side surfaces, wherein at least one of the top surface, the bottom surface and the side surfaces is structured. Structured means in this context that these surfaces are modified, for example to improve the outcoupling of light. For example, all surfaces may be structured or only some of them. Thus, the combination of smooth and structured surfaces within the wavelength conversion element is possible as well. Independently of the number of structured surfaces, the overall or directional light extraction out of the wavelength conversion element may be increased.

According to one embodiment, the at least one structured surface comprises a random roughness, a microlens, a microlens array, a micro-optic, a micro-optic array, a photonic crystal, a plasmonic array, a meta lens, a dielectric film, a stack of dielectric films or an anti-reflective coating. The stack of dielectric films comprises for example anti-reflective coatings, dichroics, and wavelength or angle-dependent pass filters. The anti-reflective coating includes a graded index anti-reflective coating. Alternatively, the at least one structured surface comprises according to one embodiment an aperiodic or pseudo-periodic arrangement of features with individual feature sizes less than two micrometers.

The surface modifications may be imparted to the wavelength conversion element during its production either by starting with a structured or patterned substrate on which the precursor material is applied or after curing by post-processing steps.

Another aspect refers to a light emitting device comprising an active electromagnetic radiation emitting layer sequence and a wavelength conversion element wherein said wavelength conversion element comprises a crosslinked matrix and at least one phosphor dispersed in that matrix, wherein said matrix is made from a precursor material chosen from one of the generic formulae wherein $R^1$ and $R^2$ are—independently from each other—chosen from a group consisting of alkyl, alkoxy, aryl, aryloxy, alkenyl, substituted alkyl, substituted alkoxy, substituted aryl, substituted aryloxy, substituted alkenyl, and combinations thereof, $R^{11}$, $R^{12}$ and $R^{13}$ are—independently from each other—chosen form a group consisting of H, alkyl, alkoxy, aryl, aryloxy, alkenyl, substituted alkyl, substituted alkoxy, substituted aryl, substituted aryloxy, substituted alkenyl, and combinations thereof, and $R^3$ and $R^4$ are—independently from each other—chosen from a group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof, $R^1$ and $R^2$ and $R^{11}$, $R^{12}$ and $R^{13}$ comprise an alkoxy content being in the range from 10 wt % to 50 wt %, and wherein the crosslinked matrix comprises an organic content of less than 40 wt %.

The light emitting device may comprise a wavelength conversion element of the above-mentioned embodiments. Thus, all features disclosed with respect to the wavelength conversion element are valid for the light emitting device, and vice-versa.

In this context, the electromagnetic radiation may be a visible radiation or an invisible radiation. A light emitting device emits electromagnetic radiation by the active electromagnetic radiation emitting layer sequence wherein said emitted radiation has a first wavelength range. The radiation of the first wavelength range is at least partially absorbed by the wavelength conversion element and converted to a radiation of a second wavelength range. The second wavelength range may have longer wavelengths than the first wavelength range. In this case the wavelength conversion element is a down-converting element.

According to one embodiment, the light emitting device is a light emitting diode (LED) or a laser diode (LD). The LED could be of the chip-on-board type or of the packaged LED type, including chip-scale packages. The wavelength conversion element may be deposited directly on the active electromagnetic radiation emitting layer sequence or deposited in proximity of the active electromagnetic radiation emitting layer sequence, or it is deposited in a remote configuration with respect to the active electromagnetic radiation emitting layer sequence. For example, it could be glued in close proximity to the LED.

Another aspect refers to a method for producing a wavelength conversion element comprising the steps of preparing a starting mixture comprising at least one phosphor and a precursor material, wherein the precursor material comprises a precursor having a structure that is chosen from one of the generic formulae wherein $R^1$ and $R^2$ are—independently from each other—chosen from a group consisting of alkyl, alkoxy, aryl, aryloxy, alkenyl, substituted alkyl, substituted alkoxy, substituted aryl, substituted aryloxy, substituted alkenyl, and combinations thereof, $R^{11}$, $R^{12}$ and $R^{13}$ are—independently from each other—chosen form a group consisting of H, alkyl, alkoxy, aryl, aryloxy, alkenyl, substituted alkyl, substituted alkoxy, substituted aryl, substituted aryloxy, substituted alkenyl, and combinations thereof, and $R^3$ and $R^4$ are—independently from each other—chosen from a group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof, wherein n is chosen such that the viscosity of the precursor is in the range of 1 to 150 mPas, and $R^1$ and $R^2$ and $R^{11}$, $R^{22}$ and $R^{13}$ comprise an alkoxy content being in the range from 10 wt % to 50 wt %, forming a layer of the starting mixture, curing the starting mixture to get a layer comprising a crosslinked matrix with the phosphor dispersed in said matrix.

With this method, a wavelength conversion element of the above-mentioned embodiments may be produced. Thus, all features disclosed with respect to the wavelength conversion element are valid for the method, and vice-versa.

This is an inexpensive method for producing wavelength conversion elements with sharp edges and smooth surfaces.

According to one embodiment, to the starting mixture at least one additive may be added, said additive being chosen from a group consisting of catalysts, inorganic microparticles, inorganic nanoparticles, metal-organic compounds, organic molecules, organically modified silicas, organically modified silicates, organically modified ceramics, organic polymers, inorganic polymers, and combinations thereof. Details of the additives are disclosed in connection with the description of the wavelength conversion element and are valid for the method as well.

For example, fumed silica may be added to the precursor to increase the viscosity of the starting mixture. Once the fumed silica is incorporated, the desired phosphor in form of a powder, or a blend of phosphor powders, is dispersed in the precursor material, being generally liquid, as well. The relative amount of phosphor and additives may depend on many criteria, such as the size of the particles, the desired color point, the desired volume and thickness of the finished wavelength conversion layer, the wavelength of the exciting radiation, the type of pump (e.g. laser or LED), the amounts of other additive materials, and other considerations.

The precursor itself, which is generally liquid, may be used with or without solvent. In some embodiments, a solvent-free approach is used which is a distinguishing factor from other materials that require solvents, for example to decrease viscosity to make them more processable, to dissolve solid materials and/or to make them solution processable.

According to one embodiment, the forming of the layer of the starting mixture takes place by molding. In this context, "molding" means that the starting material can be injected or otherwise inserted into a mold in an un-cured state. The starting material may be cured, or at least partially cured, in the mold and then removed from the mold. The groups $R^1$, $R^2$, $R^{11}$, $R^{12}$, $R^{13}$ and the number of repeat units n may be adapted accordingly, to have for example an appropriate viscosity of the precursor material.

According to another embodiment, the forming of the layer of the starting mixture is performed by a method chosen from a group consisting of tape casting, doctor blading, spray coating, dispensing, dip coating, spin coating, screen printing, and extrusion.

According to another embodiment, the forming of the layer of the starting mixture is performed on a substrate. This substrate may be used to hold the layer of the starting material. The substrate may be flexible or rigid, comprise organic or inorganic material, may be used permanently or temporarily, and/or may have flat or structured surfaces. For example, when using a tape casting process for forming the layer of the starting mixture, the substrate may comprise a flexible material, e.g. a silicone-coated PET film that is used temporarily.

According to another embodiment, the substrate comprises a structured surface. The starting material is then applied on the structured surface of the substrate. When the substrate is removed after curing the surface of the wavelength conversion element that was facing the structured surface, is structured as well.

According to another embodiment, the substrate comprises an active electromagnetic radiation emitting layer sequence of a light emitting device. Thus, the wavelength conversion element may be produced directly and in situ on the layer sequence.

According to another embodiment, the curing takes place at room temperature or at elevated temperatures, for example at temperatures of equal to or greater than 50° C. When the curing takes place at room temperature, the layer of starting material is cured in a range of between a few hours and a few days. By exposing the starting material to temperatures above room temperature, the curing can be accelerated.

According to another embodiment, the curing takes place in the presence of gaseous and/or liquid water. In the presence of humidity or if liquid water is added to the starting mixture, the mixture will begin to cure at room temperature or with mild heating at, for example, 50° C. or 150° C. or even higher.

According to another embodiment, the wavelength conversion element is removed from the substrate in a cured state or a partially cured state. After removal of the wavelength conversion element from the substrate it can be incorporated in a light emitting device and—if applicable— fully cured in situ. In this case, a temporary substrate is used. Alternatively, a permanent substrate may be used and the removal of the wavelength conversion layer may be omitted.

According to another embodiment, the curing is performed in two steps, wherein the first step is performed before applying the starting mixture on the active electromagnetic radiation emitting layer sequence to get a partially cured starting mixture, and the second step is performed after applying the partially cured starting mixture on the active electromagnetic radiation emitting layer sequence. The curing may be stopped after the first step by, for example, reducing the ambient temperature. In this embodiment, layers, foils or individual elements of the precursor material may be made in a partially cured state. The partially cured precursor material may then be—if necessary—singulated to a desired size and then incorporated into a light emitting device, like an optoelectronic device, in this state and then fully cured in situ, i.e. the remaining reactive groups in the polysiloxane or the polysilazane may react. The precursor material may be used in this embodiment as a B-stage material. Advantageously, in this embodiment the layer of the partially cured starting mixture has not to be attached with an adhesive as bondings to the active layer sequence, e.g. a light emitting chip, are produced when the starting material is fully cured.

According to another embodiment, the layer of the starting material or the layer comprising the crosslinked matrix is singulated by a singulation process. Thus, wavelength conversion elements can be achieved, having a size adapted to be used in light emitting devices.

According to another embodiment, the singulation process is chosen from a group consisting of punching, mechanically dicing, laser dicing, scribing and breaking, and water jetting.

The matrix material according to the above described embodiments is much less tacky than standard silicones. The highly crosslinked polysiloxane or polysilazane is not tacky and can be punched without any sticking problem. For example, in this method, tape casting and punching may be combined, which simplifies the manufacturing steps and reduces cost in the production of wavelength conversion elements. With this method, parts that are more uniform in terms of brightness and color point are produced because the thickness and surface roughness of the wavelength conversion elements are better controlled. For example, the maximum peak-to-valley difference of standard silicone conversion elements produced by screen printing can be an order of magnitude larger than that for the wavelength conversion element according to embodiments described herein. Similarly, the average area surface roughness is an order of magnitude larger for a standard screen-printed silicone conversion element than that of the highly crosslinked polysiloxane or polysilazane containing wavelength conversion elements.

BRIEF DESCRIPTION OF THE DRAWINGS

Additional advantages, advantageous embodiments and developments are explained in the following in connection with the figures and examples.

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the examples and figures, like parts are designated by like numerals. The depicted parts and their proportions are not to scale, rather some parts as for example layers may be depicted exaggerated large in order to improve the presentability.

According to one exemplary embodiment, a starting mixture containing as a precursor a methoxymethylpolysiloxane of the following generic formula is either made or purchased. The methoxy content is in the order of 10 to 50 wt %, advantageously in the range of 15 to 45 wt %, even more advantageously in the range of 30 to 40 wt %. The molecular weight is such that the viscosity is in the range of 1 to 50 mPas, but advantageously in the range of 2 to 20 mPas.

As a phosphor, a cerium activated gadolinium doped garnet $(Y_{1-x-y}Gd_xCe_y)_3Al_5O_{12}$, were x is in the range of 0 to 0.2 and y is in the range of >0 to ≤0.05 is added to the starting mixture. Such a phosphor is, for example, suitable for an automotive forward lighting application. The concentration of the phosphor in the starting mixture depends on the cerium concentration, the phosphor's absorptance and quantum efficiency, the target color point, and if there are other scattering additives present. A range of applicable phosphor concentrations is in the range of about 15 to 70 wt %.

Equally, it is possible to add one of the other phosphors mentioned above or even a blend of different phosphors.

According to the exemplary embodiment, fumed silica in a range of 10 to 30 wt % (based on the weight of fumed silica to the weight of silica plus the polysiloxane precursor) and approximately 10 to 80 wt % (based on the weight of the phosphor to the weight of the phosphor plus silica plus polysiloxane precursor) of $(Y_{1-x-y}Gd_xCe_y)_3Al_5O_{12}$ are added to the starting mixture containing the polysiloxane precursor. The amount of fumed silica and phosphor depends on the eventual thickness of the final conversion element. After being thoroughly mixed, additionally 1 to 5 wt % (based on the weight of the catalyst to the weight of the catalyst plus polysiloxane precursor) tetra-n-butyl titanate is added to act as a catalyst.

For example, for a thickness of the final conversion element of about 50 μm and a chromaticity coordinate cx≈0.3, 52 wt % phosphor (e.g. YAG or a YAG-based phosphor), 36 wt % polysiloxane including a catalyst (a hardener) and 12 wt % fumed silica is used. According to another example, for a thickness of the final conversion element of about 125 μm and a chromaticity coordinate cx≈0.3, 26 wt % phosphor (e.g. YAG or a YAG-based phosphor), 55 wt % polysiloxane including a catalyst (a hardener) and 19 wt % fumed silica is used. The wt % refer to the cured state of the conversion element.

The starting mixture is thoroughly blended and, if necessary milled to break apart any particle agglomerates, then tapecast on a substrate being, for example, a non-stick polymer sheet in form of a layer. The target thickness of the final, cured wavelength conversion element is in the order of 10 μm to 500 μm, but advantageously between 25 μm and 200 μm. The tapecast starting mixture is allowed to cure at room temperature in ordinary ambient conditions. The curing time depends on the thickness of the tapecast layer and the relative humidity of the ambient condition. Typically, the material is dust dry after a few hours, but requires a longer time for full mechanical strength.

Once cured, the layer is removed from the substrate and the the phosphor-in-polysiloxane wavelength conversion elements are punched out of the layer, using, for example, a numerical control punch tool. In this exemplary embodiment, the wavelength conversion elements are heat treated to a temperature that is slightly above the anticipated application temperature. Depending on that temperature, the heat treatment step could be performed before or after punching. Once punched and heat treated, the individual wavelength conversion elements are ready to be incorporated into a light emitting device based on a light emitting diode or laser diode.

Figure 1:
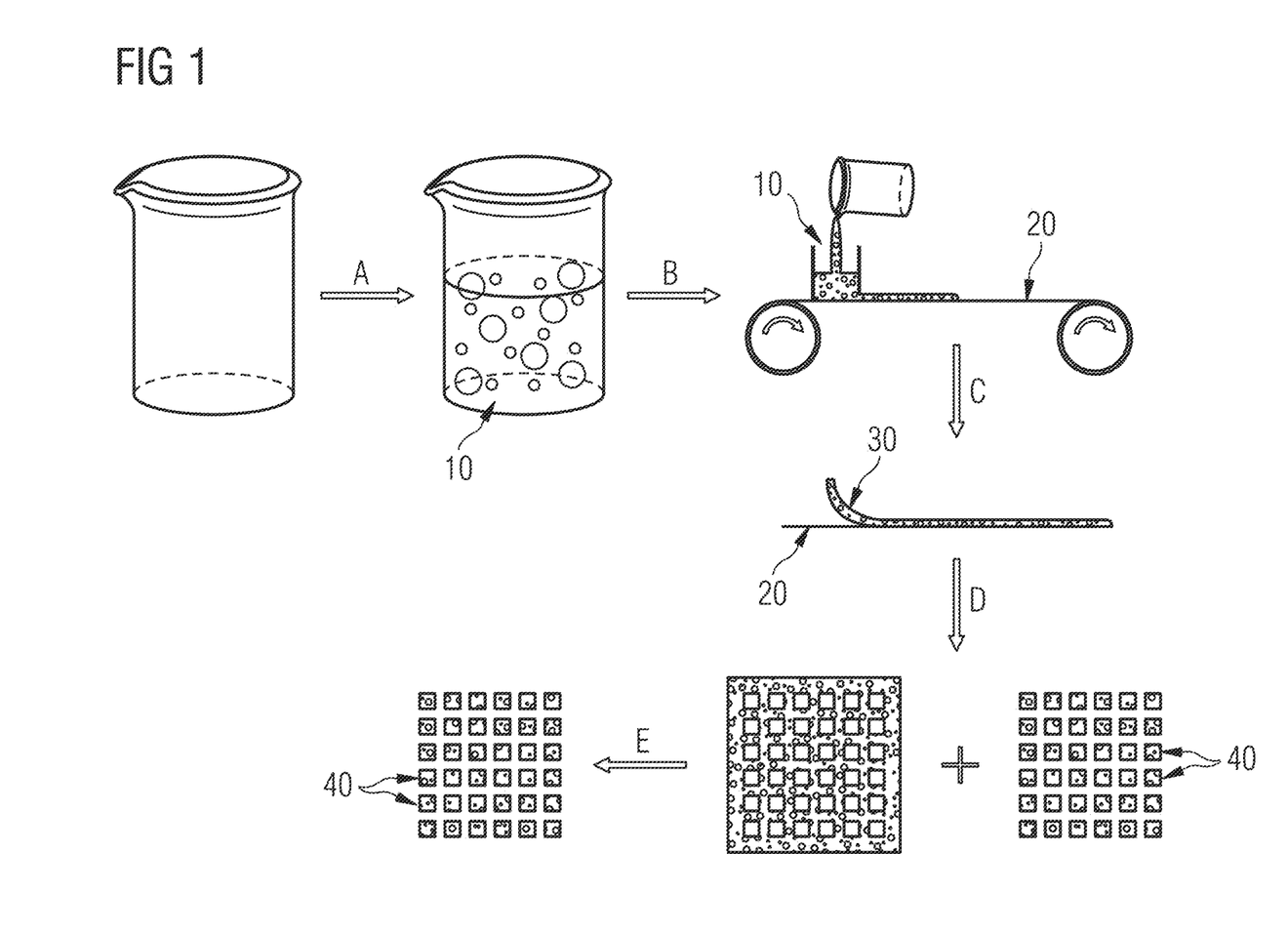
FIG. 1 shows a schematic representation of the method for producing a wavelength conversion element.

FIG. 1 shows a schematic representation of an exemplary embodiment of the method for producing a wavelength conversion element. In step A, a phosphor powder, fumed silica, a polysiloxane resin, and catalysts are mixed together to get a starting mixture 10. The starting mixture 10 is tapecast on a substrate 20, for example a carrier foil 20, in step B. The carrier foil 20 is a non-stick foil, for example a silicone laminated foil. After curing at room temperature, the layer 30 of the cured starting mixture is removed from the foil 20 in step C. In step D, the wavelength conversion elements 40 are punched out of the layer 30 to the desired size. Finally, in step E, the wavelength conversion elements 40 are heated to a temperature slightly above the application temperature in a light emitting device.

The method shown in FIG. 1 is applicable to other starting mixtures and with other methods for forming a layer 30 of the starting mixture as well. For this, in step A, any phosphors or phosphor blends may be combined with any desired additives, with a polysilazane instead of the polysiloxane and with or without a catalyst.

Step B may be performed also by methods like doctor blade, dispensing, dip coating, spray coating, or other forming steps to make layers of the starting mixture. The punching in step D may be replaced by mechanical dicing, laser dicing, scribing and breaking, or water jetting. Further, the substrate 20 may be a structured substrate to have a structured surface of the layer 30 and also structured surfaces of the wavelength conversion elements 40. Alternatively or additionally, the wavelength conversion elements 40 may be structured by post-processing steps.

In a further alternative method, in step C, the layer 30 is not completely cured but only partially cured. The partially cured layer 30 is removed from the substrate 20, singulated to get non-finished wavelength conversion elements 40 in a desired size that are arranged in light emitting devices (not shown) and there, they are fully cured. Alternatively, the partially cured layer 30 is removed from substrate 20 and transferred to a plurality of light emitting devices (not shown), cured, and either left as is or singulated along with the light emitting devices.

In a further alternative embodiment, the starting mixture 10 may also be arranged directly on an active layer sequence of a light emitting device instead of the substrate 20. In this case, the punching step D is omitted.

Figure 2:
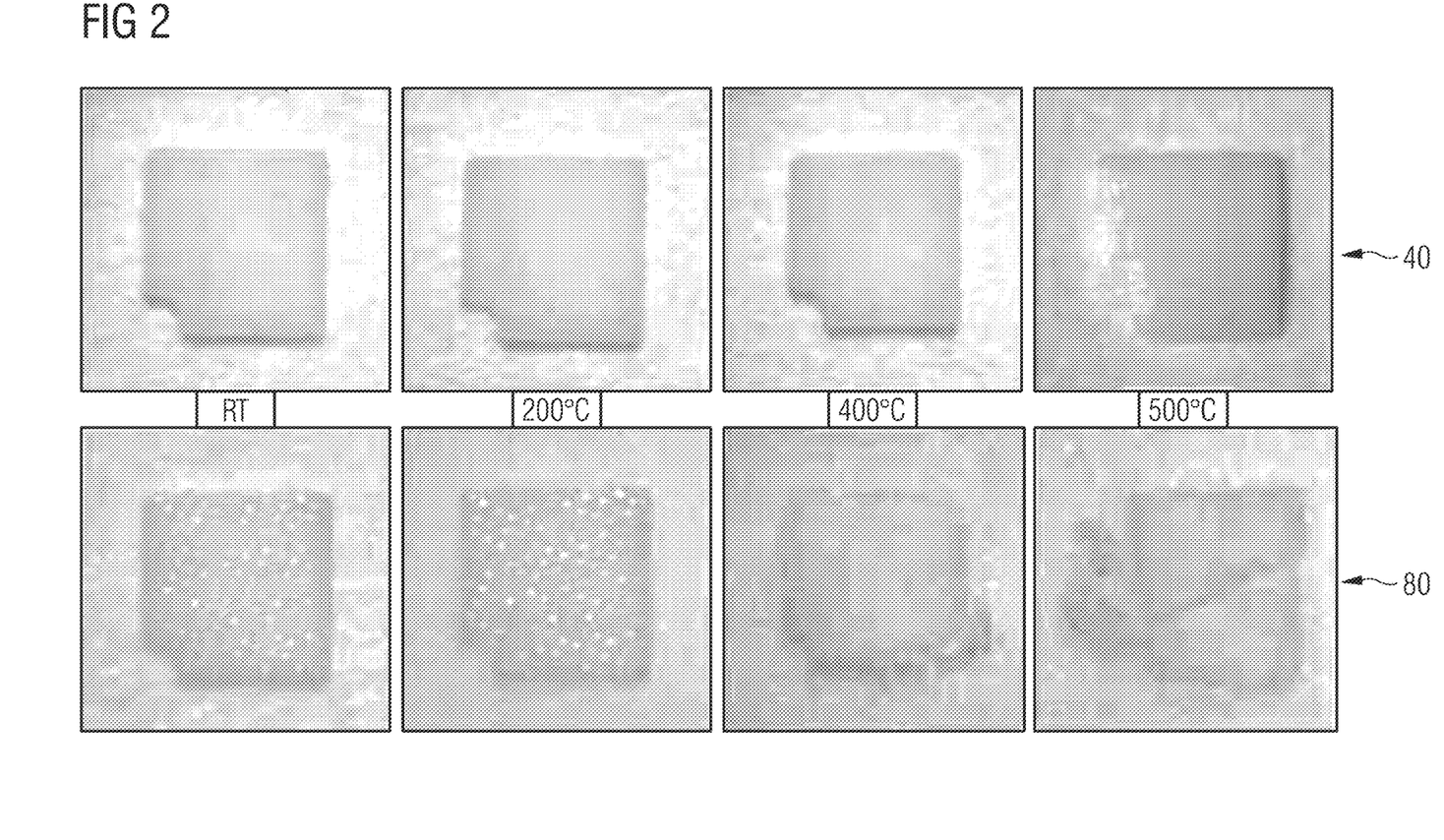
FIG. 2 shows images of the wavelength conversion element and of a comparative conversion element at different temperatures.

The wavelength conversion elements 40 as, for example, described in the exemplary embodiment and with respect to FIG. 1, are especially thermally stable. This can be seen, for example, in FIG. 2. FIG. 2 shows images of wavelength conversion elements 40 (upper row) and comparative conversion elements 80 (lower row). The elements are shown after exposure to different temperatures, namely at room temperature (RT), at 200° C., at 400° C., and at 500° C. The size of all elements is 1 mm$^2$, each having a notch for electrical connection. The phosphor in the wavelength conversion element 40 (upper row) and also in the comparative conversion element 80 (lower row) is YAG:Ce that is embedded in the polysiloxane matrix in case of the wavelength conversion element 40 and in a standard silicone matrix in case of the comparative conversion element 80. The annealing at different temperatures is performed for two hours. In the case of the wavelength conversion element 40, there is no browning or mechanical failure even at 500° C. In contrast, the annealing of the comparative conversion element 80 at corresponding temperatures leads to crumbles or breaks with slight imparted forces that are typical of state of the art handling equipment whereas the wavelength conversion elements 40 shown in the upper row remain intact.

FIGS. 3A to 5 relate to the edge quality of the wavelength conversion elements 40. FIG. 3A-3D show schematic representations of the cross-sections of four exemplary conversion elements, each having top angles 41, bottom angles 42, top edges 43 and bottom edges 44. For the sake of clarity the numerals are only shown with respect to FIG. 3A.

Figure 3A:
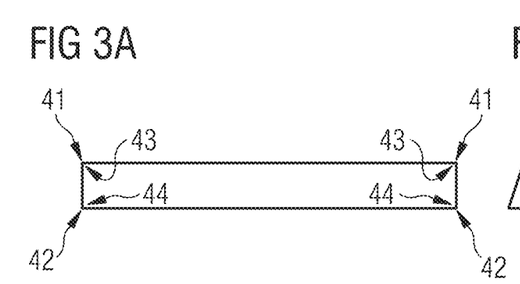
FIG. 3A-3D show schematic cross-sections of the wavelength conversion element and comparative conversion elements.
Figure 3B:
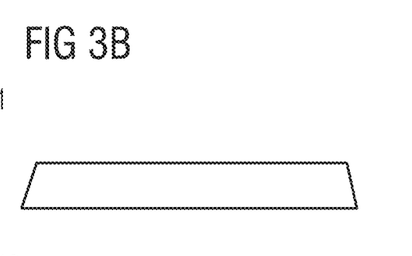
Figure 3C:
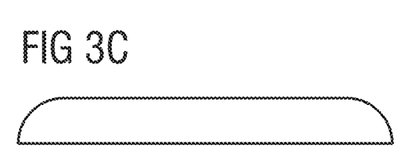
Figure 3D:
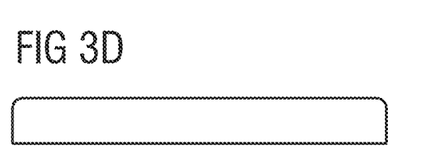

In FIG. 3A, top angles 41 and bottom angles 42 are 90°, and the curvature for the top edges 43 and the bottom edges 44 has a small radius. In FIG. 3B, top angles 41 and bottom angles 42 are far from 90°, the top edges 43 and the bottom edges 44 have a small radius of curvature. In FIG. 3C, the top angles 41 and bottom angles 42 are difficult to define but are not equal to 90°, the radius of curvature for the top edges 43 is large. In FIG. 3D, the top angles 41 and bottom angles 42 are 90°, the top edges 43 have a radius of curvature between that of FIG. 3A and FIG. 3C.

The edge quality of a wavelength coversion element 40 is important as, for example, LEDs are sealed by a reflective sealing material 70 after the wavelength conversion element 40 is applied to the active layer sequence 50. The reflective sealing material 70, as for example titanium dioxide (TiO$_2$) particles in silicone, has to stop at the upper edges 43 of the wavelength conversion element 40 and it should not reach the upper surface of the conversion element. For this purpose, the top angles 41 and bottom angles 42 of the wavelength conversion element 40 according to embodiments are in the range of 80° to 100° and have a radius curvature of smaller or equal to 20 μm.

Figure 4A:
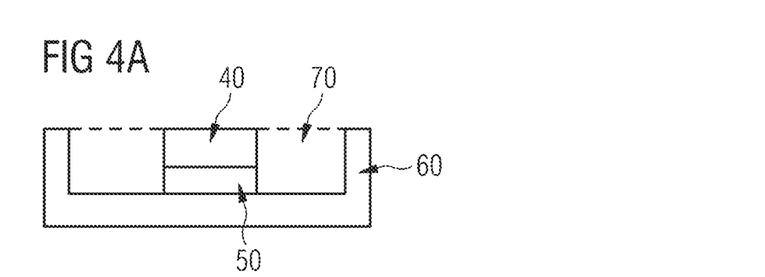
FIG. 4A-4C show schematic cross-sections of LED packages with the wavelength conversion element and with comparative conversion elements.
Figure 4B:
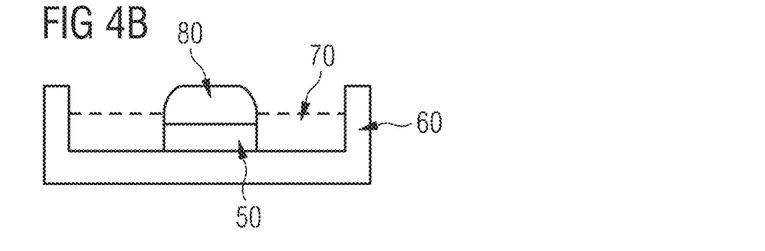
Figure 4C:
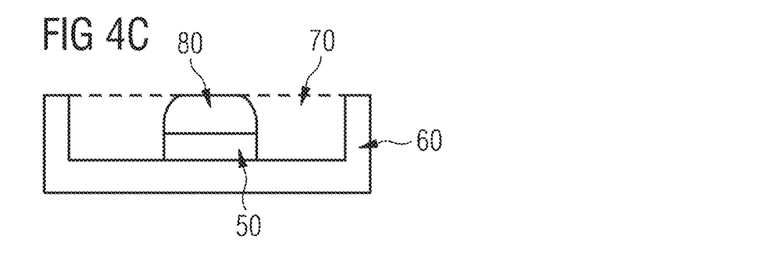

FIG. 4A-4C visualize the effects of edges with a high quality and a poor quality. In FIG. 4A, a simplified schematic cross-section of an LED package is shown. The wavelength conversion element 40 is applied on an active layer sequence 50, both being arranged in a housing 60. The wavelength conversion element 40 and the active layer sequence 50 are surrounded by a reflective sealing material 70, for example TiO$_2$ in silicone. The wavelength conversion element 40 in FIG. 4A has top angles 41 and bottom angles 42 of around 90°. Therefore, the reflective sealing material 70 reaches the top surface of the wavelength conversion element 40 but stops at this surface so that no reflective sealing material 70 reaches the top surface.

FIGS. 4B and 4C show comparative conversion elements 80 with top angles 41 being hard to be defined. As a result, they have a significant curvature that slopes from the top surface to the bottom surface of the comparative conversion elements 80. This is a problem for color uniformity of the light emitting device and can cause further packaging problems. If these elements 80 are surrounded by a reflective sealing material 70 as, for example, TiO$_2$ filled silicone, it is difficult or even impossible to get the proper volume of reflective sealing material 70 dispensed into the housing 60. The results may be an under-fill condition (FIG. 4B) where the element 80 is not surrounded by the reflective sealing material 70 and does not benefit from its presence, and an overfill condition (FIG. 4C) where parts of the element 80 are covered by the reflective sealing material 70 that will cause a drop in light output since the desired light path is blocked by reflective sealing material 70.

Figure 5:
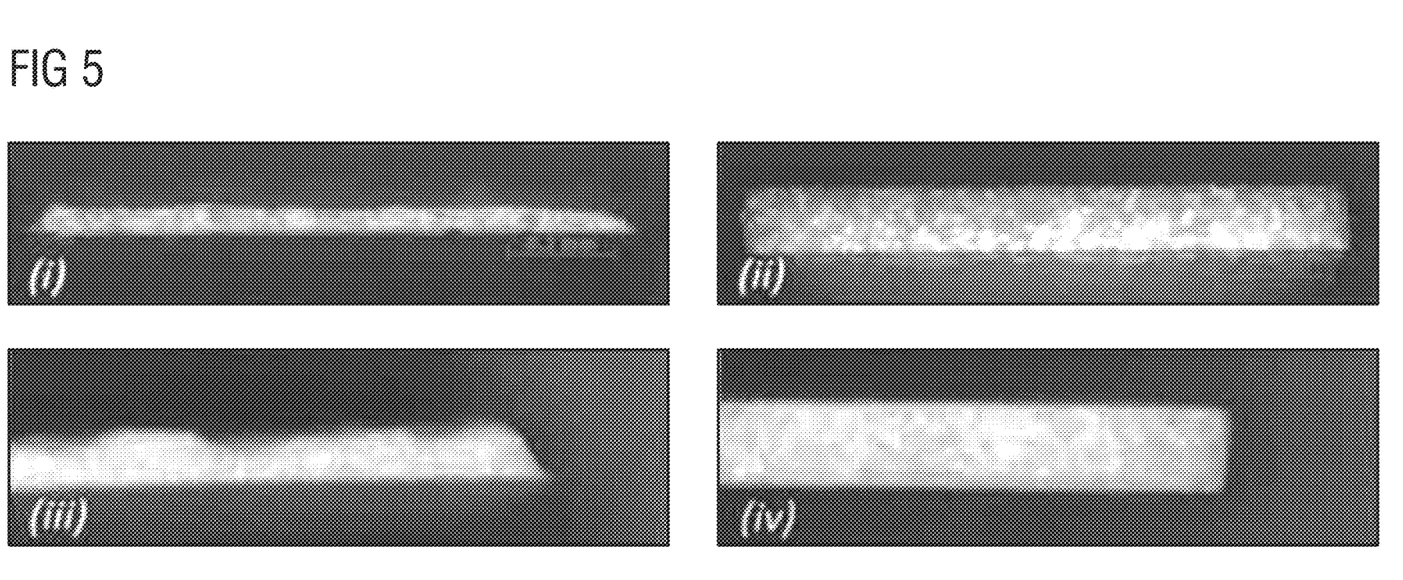
FIG. 5 shows images of the wavelength conversion element and comparative conversion elements.

FIG. 5 shows images of comparative conversion elements 80 ((i) and (iii)) and wavelength conversion elements 40 according to embodiments of the present disclosure ((ii) and (iv)). FIG. 5(*i*) shows a two phosphor component, screen-printed silicone-based converter element 80 having a poor edge quality. In comparison, FIG. 5(*ii*) shows a two phosphor component polysiloxane-based conversion element 40 having a high edge quality, i.e. top angles 41 and bottom angles 42 of about 90° and a radius curvature of ≤20 μm. FIG. 5(*iii*) shows a single phosphor, screen-printed silicone-based converter 80 having a poor edge quality. In contrast, FIG. 5(*iv*) shows a single phosphor polysiloxane-based conversion element 40 with a high edge quality.

Figure 6:
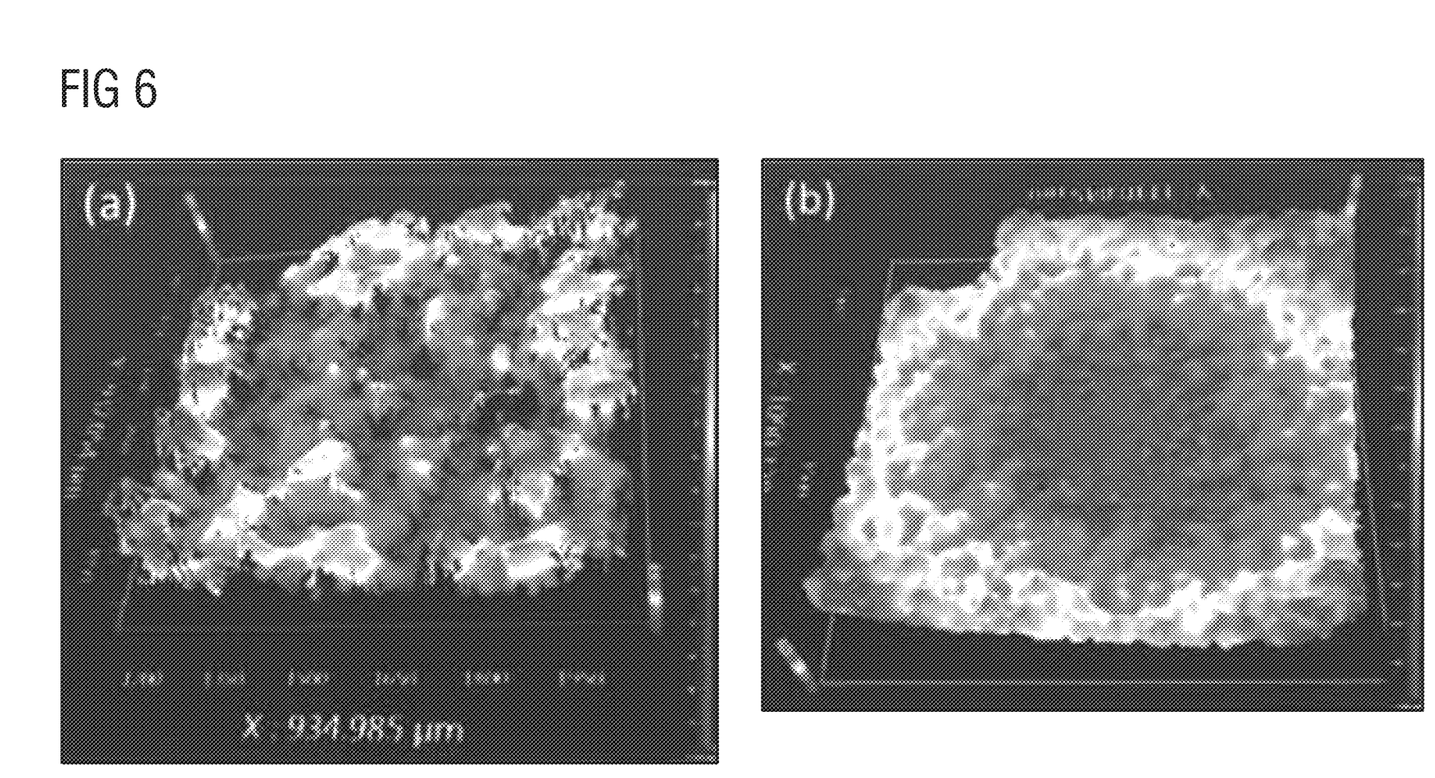
FIG. 6 shows laser interferometer data of a comparative conversion element and of the wavelength conversion element.

The wavelength conversion elements 40 according to embodiments of the present disclosure are even more uniform in terms of brightness and color point because the thickness and surface roughness are better controlled. As shown in FIG. 6 by laser interferometer data displaying the surface morphology, the maximum peak-to-valley difference for a comparative silicone conversion element 80 (FIG. 6a) is an order of magnitude larger than for a polysiloxane wavelength conversion element 40 (FIG. 6b). While the peak-to-valley difference for the comparative conversion element 80 is larger than 16 µm, the peak-to-valley height of the wavelength conversion element 40 according to embodiments is around 2.5 µm. Similarly, the average area surface roughness $S_a$ is an order of magnitude larger (2.35 µm) for the comparative silicone converter 80 than for the polysiloxane wavelength conversion element 40 (0.12 µm).

Figure 7:
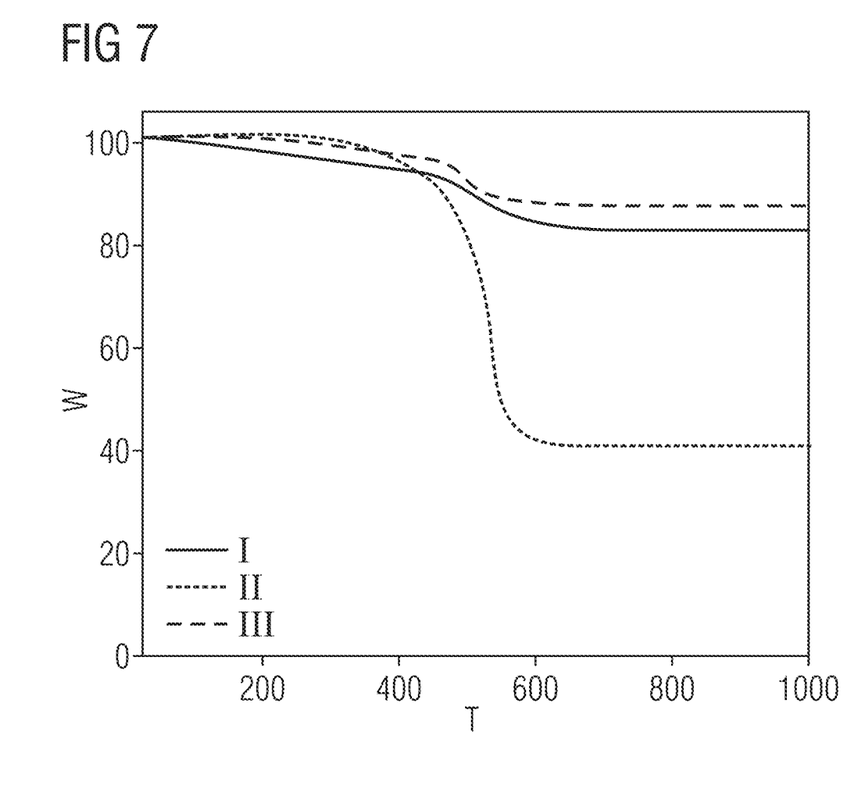
FIG. 7 shows thermogravimetric analysis profiles of a comparative conversion element and a wavelength conversion element.

FIG. 7 shows a thermogravimetric analysis profile of a comparative conversion element 80 containing a methyl silicone (II) in comparison to a wavelength conversion element 40 of polysiloxane (I) and of polysiloxane with 25 wt % silica filler (III). The x-axis shows the temperature T in ° C., the y-axis shows the weight W in %. The polysiloxane precursor used to make the cross-linked examples (I) and (III) has a content of methoxy of about 35 wt % and a viscosity of around 5 mPas. As shown in FIG. 7, the polysiloxane without filler (I) already has a greatly reduced organic content in comparison to a typical methyl silicone (II), but the filler material as in example (III) can reduce the organic content even further. The low organic content of the crosslinked matrix is obtained due to the increased number of crosslinks and a reduced number of side chains.

Figure 8:
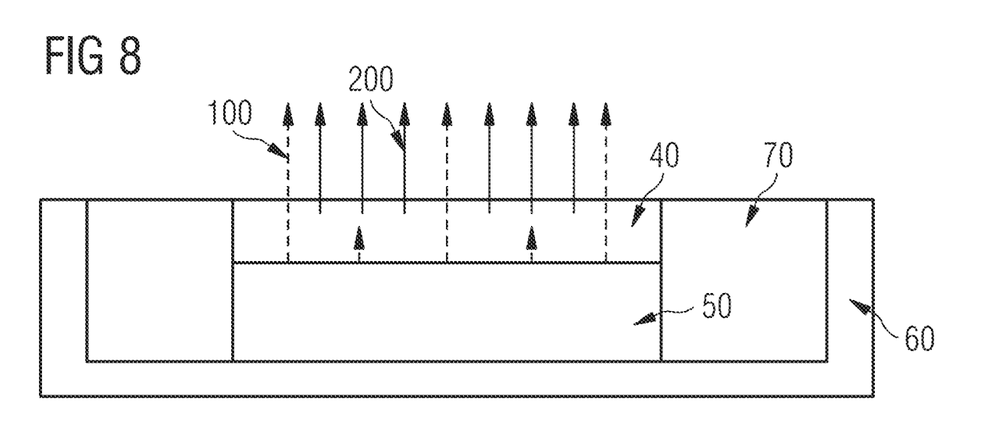
FIG. 8 shows a schematic cross-section of a light emitting device.

FIG. 8 shows a schematic cross-section of a light emitting device, for example an LED package. An active layer sequence 50 is arranged in a housing 60. A wavelength conversion element 40 is arranged on the layer sequence 50. Both are surrounded by a reflective sealing material 70, for example a $TiO_2$ filled silicone. The active layer sequence emits light, i.e. electromagnetic radiation in a first wavelength range 100. The wavelength conversion element 40 at least partially absorbs the electromagnetic radiation of the first wavelength range 100 and converts it to a second radiation of a second wavelength range 200 comprising wavelengths being larger than wavelengths of the first wavelength range 100. The entire emission of the light emitting device is composed of the first and second wavelength ranges 100, 200.

The wavelength conversion element 40 may be applied in a laser diode based light source as well.

The scope of protection of the present disclosure is not limited to the examples given hereinabove. The present disclosure is embodied in each novel characteristic and each combination of characteristics, which particularly includes every combination of any features which are stated in the claims, even if this feature or this combination of features is not explicitly stated in the claims or in the examples.

REFERENCE LIST 10 starting mixture
20 substrate
30 layer
40 wavelength conversion element
41 top angle
42 bottom angle
43 top edge
44 bottom edge
50 active layer sequence
60 housing
70 reflective sealing material
80 comparative conversion element
100 first wavelength range
200 second wavelength range
T temperature
W weight

What is claimed is:

1. A wavelength conversion element comprising a cross-linked matrix and at least one phosphor dispersed in said matrix, wherein said matrix is made from a precursor material comprising a precursor having a structure chosen from one of the generic formulae wherein R$^1$ and R$^2$ are—independently from each other—chosen from a group consisting of alkyl, alkoxy, aryl, aryloxy, alkenyl, substituted alkyl, substituted alkoxy, substituted aryl, substituted aryloxy, substituted alkenyl and combinations thereof, R$^{11}$, R$^{12}$ and R$^{13}$ are—independently from each other—chosen form a group consisting of H, alkyl, alkoxy, aryl, aryloxy, alkenyl, substituted alkyl, substituted alkoxy, substituted aryl, substituted aryloxy, substituted alkenyl, and combinations thereof, and R$^3$ and R$^4$ are—independently from each other—chosen from a group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof,

R$^1$ and R$^2$ and R$^{11}$, R$^{12}$ and R$^{13}$ comprise an alkoxy content being in the range from 10 wt % to 50 wt %, and wherein the crosslinked matrix comprises an organic content of less than 40 wt %, wherein the precursor material for the crosslinked matrix comprises a substituted polysiloxane or a substituted polysilazane precursor, and wherein a backbone of the substituted polysiloxane precursor consists of alternating silicon and oxygen atoms, or wherein a backbone of the substituted polysilazane precursor consists of alternating silicon and nitrogen atoms.

2. The wavelength conversion element according to claim 1, wherein the crosslinked matrix comprises an organic content of less than or equal to 25 wt %.

3. The wavelength conversion element according to claim 1, wherein the crosslinked matrix comprises a three-dimensional siloxane-based network having the generic formula wherein each R is—independently from each other—chosen from a group consisting of a group listed for $R^1$, $R^2$, $R^3$, $R^4$, $R^{11}$, $R^{12}$, $R^{13}$, or any combination thereof, and the dangling bonds are—independently from each other—representative of a continuation of the network and one of the groups listed for $R^1$, $R^2$, $R^3$, $R^4$, $R^{11}$, $R^{12}$, $R^{13}$.

4. The wavelength conversion element according to claim 1, wherein the precursor material additionally comprises at least one additive that is chosen from a group consisting of catalysts, inorganic microparticles, inorganic nanoparticles, metal-organic compounds, organic molecules, organically modified silicas, organically modified silicates, organically modified ceramics, organic polymers, inorganic polymers, and combinations thereof.

5. The wavelength conversion element according to claim 1, wherein the at least one phosphor is chosen from a group consisting of
$(RE_{1-x}Ce_x)_3(Al_{1-y}A'_y)_5O_{12}$ with $0<x\leq0.1$ and $0\leq y\leq1$,
$(RE_{1-x}Ce_x)_3(Al_{5-2y}Mg_ySi_y)O_{12}$ with $0<x\leq0.1$ and $0\leq y\leq2$,
$(RE_{1-x}Ce_x)_3A_{5-2y}Si_yO_{12-y}N_y$ with $0<x\leq0.1$ and $0\leq y\leq0.5$,
$(RE_{1-x}Ce_x)_2CaMg_2Si_3O_{12}:Ce^{3+}$ with $0<x\leq0.1$,
$(AE_{1-x}Eu_x)_2Si_5N_8$ with $0<x\leq0.1$,
$(AE_{1-x}Eu_x)AlSiN_3$ with $0<x\leq0.1$,
$(AE_{1-x}Eu_x)_2Al_2Si_2N_6$ with $0<x\leq0.1$,
$(Sr_{1-x}Eu_x)LiAl_3N_4$ with $0<x\leq0.1$,
$(AE_{1-x}Eu_x)_3Ga_3N_5$ with $0<x\leq0.1$,
$(AE_{1-x}Eu_x)Si_2O_2N_2$ with $0<x\leq0.1$,
$(AE_xEu_y)Si_{12-2x-3y}Al_{2x+3y}O_yN_{16-y}$ with $0.2\leq x\leq2.2$ and $0<y\leq0.1$,
$(AE_{1-x}Eu_x)_2SiO_4$ with $0<x\leq0.1$,
$(AE_{1-x}Eu_x)_3Si_2O_5$ with $0<x\leq0.1$,
$K_2(Si_{1-x-y}Ti_yMn_x)F_6$ with $0<x\leq0.2$ and $0<y\leq1-x$,
$(AE_{1-x}Eu_x)_5(PO_4)_3Cl$ with $0<x\leq0.2$,
$(AE_{1-x}Eu_x)Al_{10}O_{17}$ with $0<x\leq0.2$,
$(Y_{1-x-y}Gd_xCe_y)_3Al_5O_{12}$ with $0\leq x\leq0.2$ and $0<y\leq0.05$, and combinations thereof,
wherein RE is one or more of Y, Lu, Tb and Gd, AE is one ore more of Mg, Ca, Sr, Ba, A' is one or more of Sc and Ga,
wherein the phosphors optionally include one ore more of halides.

6. The wavelength conversion element according to claim 1, wherein the element has a cuboid-like shape with top angles and bottom angles, said top angles and bottom angles being in the range of 80° to 1000, and with top edges and bottom edges, said top edges and bottom edges having a radius curvature of $\leq 20$ µm.

7. The wavelength conversion element according to claim 1, wherein the element comprises a top surface, a bottom surface and side surfaces, wherein at least one of the top surface, the bottom surface and the side surfaces is structured.

8. The wavelength conversion element according to claim 7, wherein the at least one structured surface comprises a random roughness, a microlense, a microlense array, a micro-optic, a micro-optic array, a photonic crystal, a plasmonic array, a meta lense, a dielectric film, a stack of dielectric films, or an anti-reflective coating.

9. A light emitting device comprising an active electromagnetic radiation emitting layer sequence and a wavelength conversion element wherein said wavelength conversion element comprises a crosslinked matrix and at least one phosphor dispersed in said matrix, wherein said matrix is made from a precursor material chosen from one of the generic formulae
wherein
$R^1$ and $R^2$ are—independently from each other—chosen from a group consisting of alkyl, alkoxy, aryl, aryloxy, alkenyl, substituted alkyl, substituted alkoxy, substituted aryl, substituted aryloxy, substituted alkenyl, and combinations thereof,
$R^{11}$, $R^{12}$ and $R^{13}$ are—independently from each other—chosen form a group consisting of H, alkyl, alkoxy, aryl, aryloxy, alkenyl, substituted alkyl, substituted alkoxy, substituted aryl, substituted aryloxy, substituted alkenyl, and combinations thereof, and
$R^3$ and $R^4$ are—independently from each other—chosen from a group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof,
$R^1$ and $R^2$ and $R^{11}$, $R^{12}$ and $R^{13}$ comprise an alkoxy content being in the range from 10 wt % to 50 wt %, and
wherein the crosslinked matrix comprises an organic content of less than 40 wt %,
wherein the precursor material for the crosslinked matrix comprises a substituted polysiloxane or a substituted polysilazane precursor, and wherein a backbone of the substituted polysiloxane precursor consists of alternating silicon and oxygen atoms, or wherein a backbone of the substituted polysilazane precursor consists of alternating silicon and nitrogen atoms.

10. The light emitting device according to claim 9 being an LED or a laser diode.

11. A method for producing a wavelength conversion element comprising steps of
preparing a starting mixture comprising at least one phosphor and a precursor material,
wherein the precursor material comprises a precursor having a structure that is chosen from one of the generic formulae wherein
- $R^1$ and $R^2$ are—independently from each other—chosen from a group consisting of alkyl, alkoxy, aryl, aryloxy, alkenyl, substituted alkyl, substituted alkoxy, substituted aryl, substituted aryloxy, substituted alkenyl, and combinations thereof,
- $R^{11}$, $R^{12}$ and $R^{13}$ are—independently from each other—chosen form a group consisting of H, alkyl, alkoxy, aryl, aryloxy, alkenyl, substituted alkyl, substituted alkoxy, substituted aryl, substituted aryloxy, substituted alkenyl, and combinations thereof, and
- $R^3$ and $R^4$ are—independently from each other—chosen from a group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof, wherein n is chosen such that the viscosity of the precursor is in the range of 1 to 150 mPas, wherein the precursor material for the crosslinked matrix comprises a substituted polysiloxane or a substituted polysilazane precursor, and wherein a backbone of the substituted polysiloxane precursor consists of alternating silicon and oxygen atoms, or wherein a backbone of the substituted polysilazane precursor consists of alternating silicon and nitrogen atoms, and $R^1$ and $R^2$ and $R^{11}$, $R^{12}$ and $R^{13}$ comprise an alkoxy content being in the range from 10 wt % to 50 wt %, forming a layer of the starting mixture, curing the starting mixture to get a layer comprising a crosslinked matrix comprising the phosphor dispersed in the crosslinked matrix, wherein the crosslinked matrix comprises an organic content of less than 40 wt %.

12. The method according to claim 11, wherein to the starting mixture at least one additive is added, the additive being chosen from a group consisting of catalysts, inorganic microparticles, inorganic nanoparticles, metal-organic compounds, organic molecules, organically modified silicas, organically modified silicates, organically modified ceramics, organic polymers, inorganic polymers, and combinations thereof.

13. The method according to claim 11, wherein the forming of the layer of the starting mixture takes place by a method chosen from a group consisting of molding, tape casting, doctor blading, spray coating, dispensing, dip coating, spin coating, extrusion, and screen printing.

14. The method according to claim 11, wherein the forming of the layer of the starting mixture is performed on a substrate.

15. The method according to claim 14, wherein the substrate comprises an active electromagnetic radiation emitting layer sequence of a light emitting device.

16. The method according to claim 14, wherein the substrate comprises a structured surface.

17. The method according to claim 11, wherein the curing takes place at room temperature or at elevated temperatures.

18. The method according to claim 14, wherein the wavelength conversion element is removed from the substrate in a cured state or a partially cured state.

19. The method according to claim 15, wherein the curing is performed in two steps, wherein a first step is performed before applying the starting mixture on the active electromagnetic radiation emitting layer sequence to get a partially cured starting mixture and a second step is performed after applying the partially cured starting mixture on the active electromagnetic radiation emitting layer sequence.

20. The method according to claim 11 wherein the layer of the starting mixture or the layer comprising the crosslinked matrix is singulated by a singulation process, wherein the singulation process is chosen from a group consisting of punching, mechanically dicing, laser dicing, scribing and breaking, and water jetting.

21. A wavelength conversion element comprising a crosslinked matrix and at least one phosphor dispersed in said matrix, wherein said matrix is made from a precursor material comprising a precursor having a structure chosen from one of the generic formulae wherein
- $R^1$ and $R^2$ are—independently from each other—chosen from a group consisting of alkyl, alkoxy, aryl, aryloxy, alkenyl, substituted alkyl, substituted alkoxy, substituted aryl, substituted aryloxy, substituted alkenyl and combinations thereof,
- $R^{11}$, $R^{12}$ and $R^{13}$ are—independently from each other—chosen form a group consisting of H, alkyl, alkoxy, aryl, aryloxy, alkenyl, substituted alkyl, substituted alkoxy, substituted aryl, substituted aryloxy, substituted alkenyl, and combinations thereof, and
- $R^3$ and $R^4$ are—independently from each other—chosen from a group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof,
- $R^1$ and $R^2$ and $R^{11}$, $R^{12}$ and $R^{13}$ comprise an alkoxy content being in the range from 10 wt % to 50 wt %, wherein the crosslinked matrix comprises an organic content of less than 40 wt %, wherein the element has a cuboid-like shape with top angles and bottom angles, said top angles and bottom angles being in the range of 80° to 1000, and with top edges and bottom edges, said top edges and bottom edges having a radius curvature of ≤20 μm.

* * * * *

UNITED STATES PATENT AND TRADEMARK OFFICE
CERTIFICATE OF CORRECTION

PATENT NO. : 10,570,333 B2
APPLICATION NO. : 15/602175
DATED : February 25, 2020
INVENTOR(S) : Alan Piquette et al.

Page 1 of 1

It is certified that error appears in the above-identified patent and that said Letters Patent is hereby corrected as shown below:

In the Claims

Column 17, Line 40, Claim 5: please remove "$A_{5-2y}$" and insert --$Al_{5-y}$--.

Column 17, Line 65, Claim 6: please remove "1000" and insert --100°--.

Column 20, Line 57, Claim 21: please remove "1000" and insert --100°--.

Signed and Sealed this
Twenty-sixth Day of May, 2020

Andrei Iancu
*Director of the United States Patent and Trademark Office*